(12) United States Patent
Tian et al.

(10) Patent No.: US 8,743,552 B2
(45) Date of Patent: Jun. 3, 2014

(54) EXPANSION APPARATUS FOR SERIAL ADVANCED TECHNOLOGY ATTACHMENT DUAL IN-LINE MEMORY MODULE AND MOTHERBOARD FOR SUPPORTING THE EXPANSION APPARATUS

(75) Inventors: Bo Tian, Shenzhen (CN); Kang Wu, Shenzhen (CN)

(73) Assignees: Hong Fu Jin Precision Industry (ShenZhen) Co., Ltd., Shenzhen (CN); Hon Hai Precision Industry Co., Ltd., New Taipei (TW)

( * ) Notice: Subject to any disclaimer, the term of this patent is extended or adjusted under 35 U.S.C. 154(b) by 296 days.

(21) Appl. No.: 13/217,161

(22) Filed: Aug. 24, 2011

(65) Prior Publication Data

US 2013/0038999 A1 Feb. 14, 2013

(30) Foreign Application Priority Data

Aug. 8, 2011 (CN) .......................... 2011 1 0225507

(51) Int. Cl.
| | |
|---|---|
| *H05K 5/00* | (2006.01) |
| *H05K 7/00* | (2006.01) |
| *G06F 1/16* | (2006.01) |
| *H05K 7/16* | (2006.01) |
| *H05K 1/14* | (2006.01) |
| *H05K 1/00* | (2006.01) |
| *H05K 1/18* | (2006.01) |
| *H01R 9/00* | (2006.01) |
| *H05K 1/11* | (2006.01) |
| *H05K 1/02* | (2006.01) |
| *G06F 3/06* | (2006.01) |

(52) U.S. Cl.
CPC .............. *H05K 1/0231* (2013.01); *H05K 1/141* (2013.01); *H05K 1/117* (2013.01); *G06F 3/0658* (2013.01); *G06F 3/0683* (2013.01)
USPC ................. 361/748; 361/679.31; 361/679.32; 361/679.41; 361/728; 361/736; 361/760; 361/772; 361/777; 361/803

(58) Field of Classification Search
CPC ....... G06F 3/0683; G06F 3/0658; G06F 1/26; H05K 1/117; H05K 1/141; H05K 1/0231; H05K 2201/044; H05K 2201/09954; H05K 2201/10159
USPC .......... 361/679.31, 679.32, 679.41, 785, 803, 361/792, 736, 728, 748, 760, 772, 777
See application file for complete search history.

(56) References Cited

U.S. PATENT DOCUMENTS

| | | | |
|---|---|---|---|
| 7,310,240 B2* | 12/2007 | Petersen | 361/782 |
| 2010/0167557 A1* | 7/2010 | Hoang | 439/62 |
| 2010/0241799 A1* | 9/2010 | Schuette | 711/104 |

* cited by examiner

*Primary Examiner* — Anthony Haughton
(74) *Attorney, Agent, or Firm* — Novak Druce Connolly Bove + Quigg LLP

(57) ABSTRACT

A motherboard assembly includes a motherboard and an expansion apparatus. The motherboard includes a first expansion slot. An edge connector is set on a bottom side of the expansion apparatus to be detachably engaged in the first expansion slot. A number of SATA interfaces and a number of second expansion slots are arranged on the expansion apparatus, and are connected to signal pins and power pins of the edge connector.

7 Claims, 3 Drawing Sheets

EXPANSION APPARATUS FOR SERIAL ADVANCED TECHNOLOGY ATTACHMENT DUAL IN-LINE MEMORY MODULE AND MOTHERBOARD FOR SUPPORTING THE EXPANSION APPARATUS

BACKGROUND

1. Technical Field

The present disclosure relates to an expansion apparatus for a serial advanced technology attachment dual in-line memory module (SATA DIMM) and a motherboard for supporting the expansion apparatus.

2. Description of Related Art

Solid state drives (SSD) store data on chips instead of on magnetic or optical discs, to be used for adding storage capacity. One type of SSD has the form factor of a DIMM module and it is called a SATA DIMM module. The SATA DIMM module can be inserted into a memory slot of a motherboard, to receive voltages from the motherboard through the memory slot and receive hard disk drive (HDD) signals through SATA connectors arranged on the SATA DIMM module and connected to a SATA connector of the motherboard. However, the number of memory slots is limited, thus the memory slots of the motherboard can only receive a limited quantity of SATA DIMMs. Therefore, there is room for improvement in the art.

BRIEF DESCRIPTION OF THE DRAWINGS

Many aspects of the embodiments can be better understood with reference to the following drawings. The components in the drawings are not necessarily drawn to scale, the emphasis instead being placed upon clearly illustrating the principles of the present embodiments. Moreover, in the drawings, like reference numerals designate corresponding parts throughout the several views.

DETAILED DESCRIPTION

The disclosure, including the drawings, is illustrated by way of example and not by way of limitation. References to "an" or "one" embodiment in this disclosure are not necessarily to the same embodiment, and such references mean at least one.

Figure 1:
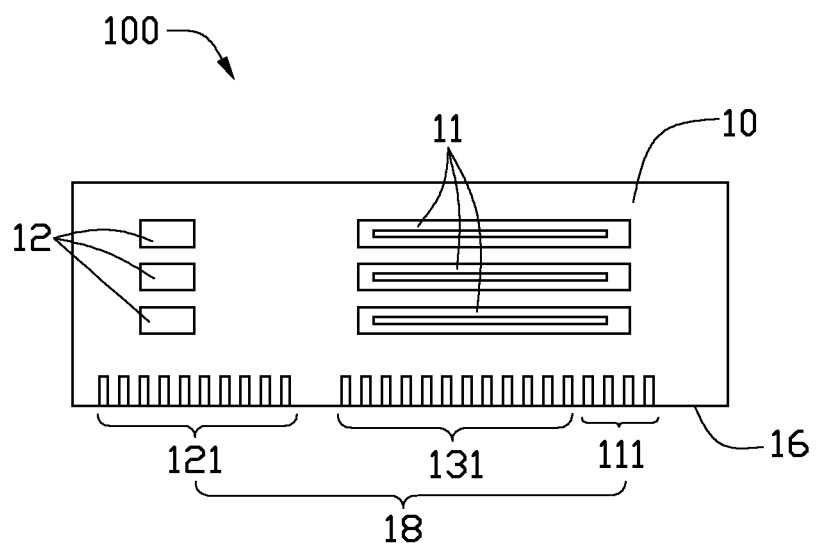
FIG. 1 is a schematic diagram of an expansion apparatus for a serial advanced technology attachment dual in-line memory module (SATA DIMM) in accordance with an exemplary embodiment of the present disclosure.

Referring to FIG. 1, an expansion apparatus 100 in accordance with an exemplary embodiment includes a substantially rectangular circuit board 10. A plurality of expansion slots 11, such as double data rate three (DDR3) memory slots, and a plurality of serial advanced technology attachment (SATA) interfaces 12 are arranged on the circuit board 10. The number of the SATA interfaces 12 is the same as the number of the expansion slots 11. The expansion slots 11 receive a plurality of serial advanced technology attachment dual in-line memory modules (SATA DIMMs) (in FIG. 3, only a SATA DIMM 40 is shown). The SATA interfaces 12 are respectively connected to SATA connectors of the SATA DIMM modules, which is connected to the expansion slots 11. An edge connector 18 is set on a long side 16 of the circuit board 10. The edge connector 18 includes a plurality of signal pins 111, a plurality of power pins 121, and a plurality of ground pins 131. The signal pins 111 include a pair of signal input pins and a pair of signal output pins. The power pins 121 are connected to the expansion slots 11. The signal pins 111 are connected to the SATA interfaces 12. The ground pins 131 are connected to a ground layer (not shown) of the circuit board 10. In one embodiment, the number of the expansion slots 11 and the SATA interfaces 12 are both three. In other embodiments, the number of the expansion slots 11 and the SATA interfaces 12 can be changed according to need.

Figure 2:
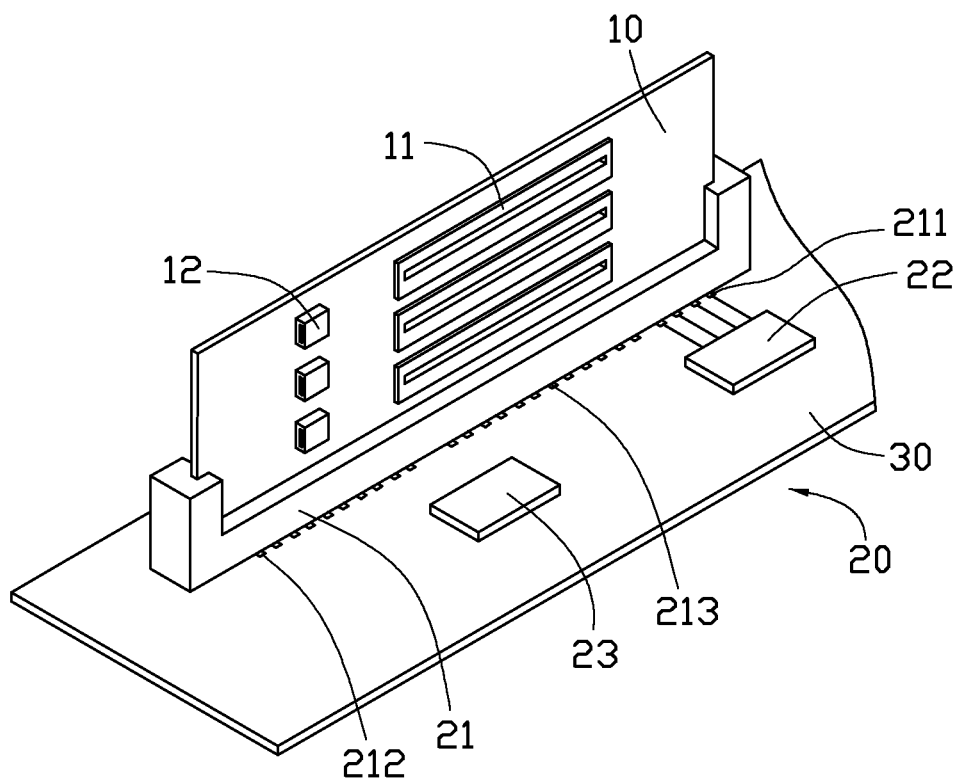
FIG. 2 is a schematic diagram of the expansion apparatus of FIG. 1 connected to a motherboard in accordance with an embodiment of the present disclosure.

Referring to FIG. 2, a motherboard 20 of an embodiment includes a circuit board 30, a hard disk drive (HDD) controller 22, a power connector 23, and an expansion slot 21, such as a peripheral component interconnection express (PCIe) slot. The HDD controller 22, the power connector 23, and the expansion slot 21 are all arranged on the circuit board 30. The expansion slot 21 includes a plurality of power pins 212 corresponding to the power pins 121 of the circuit board 10, a plurality of ground pins 213 corresponding to the ground pins 131 of the circuit board 10, and a plurality of idle pins. In one embodiment, the idle pins include four idle pins 211. The idle pins 211 are connected to the HDD controller 22. The power pins 212 are connected to the power connector 23. The ground pins 213 are connected to a ground layer (not shown) of the circuit board 30.

Figure 3:
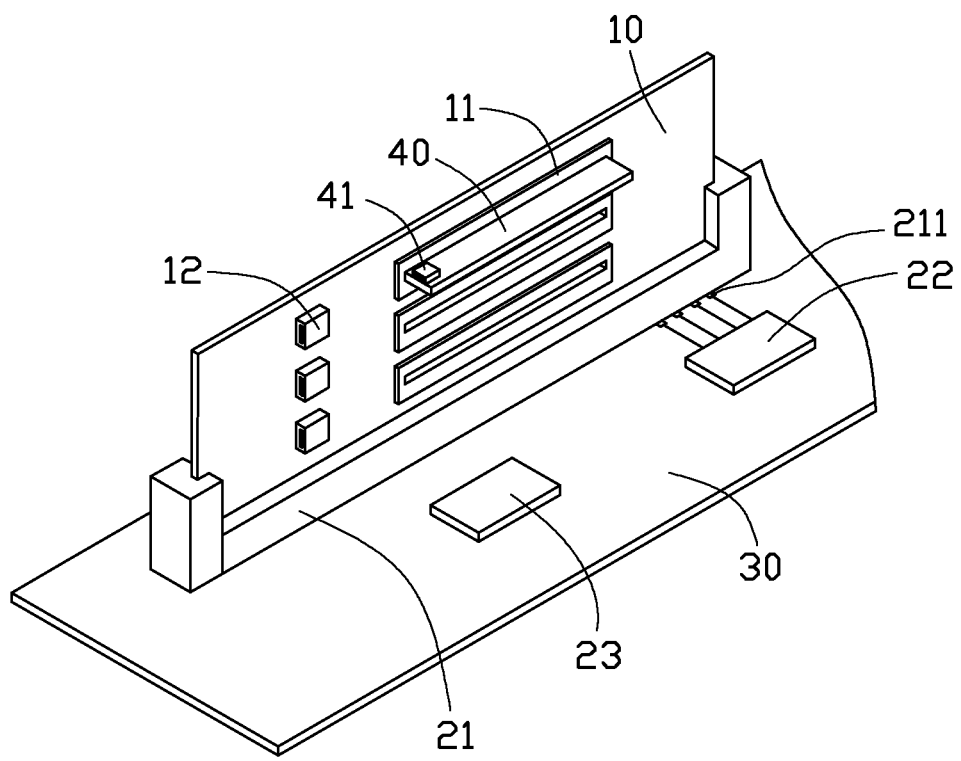
FIG. 3 is similar to FIG. 2, but shows a SATA DIMM module connected to the expansion apparatus.

Referring to FIG. 3, in use, the expansion apparatus 100 can be inserted into the expansion slot 21 of the motherboard 20 through the edge connector 18. The power pins 121, the ground pins 131, and the signal pins 111 of the circuit board 10 are respectively connected to the power pins 212, the ground pins 213, and the idle pins 211 of the expansion slot 21. A SATA DIMM module 40 is connected to one of the expansion slots 11 of the circuit board 10. A SATA connector 41 of the SATA DIMM module 40 is connected to a corresponding SATA interface 12 of the circuit board 10. When the motherboard 20 receives power, the motherboard 20 outputs a voltage to the expansion slots 11 of the circuit board 10 through the power pins 212 and 121, to provide the voltage to the SATA DIMM modules, which are connected to the expansion slots 11. At the same time, the HDD controller 22 of the motherboard 20 outputs a control signal, such as a SATA signal to the SATA DIMM module 40, which are connected to the expansion slot 11, through the idle pins 211, the signal pins 111, the SATA interfaces 12, and the SATA connector 41. Therefore, the motherboard 20 can communicate with the SATA DIMM module 40, which is connected to the expansion slot 11. The number of the SATA DIMM modules 40, which are connected to the expansion slots 11 can be selected according to need.

The motherboard 20 can expand storage capacity conveniently through connecting a plurality of SATA DIMM modules 40 to the expansion slots 11 of the expansion apparatus 100.

Even though numerous characteristics and advantages of the disclosure have been set forth in the foregoing description, together with details of the structure and function of the disclosure, the disclosure is illustrative only, and changes may be made in detail, especially in matters of shape, size, and the arrangement of parts within the principles of the disclosure to the full extent indicated by the broad general meaning of the terms in which the appended claims are expressed.

What is claimed is:

1. An expansion apparatus for a serial advanced technology attachment dual in-line memory module (SATA DIMM), the expansion apparatus comprising:
   a circuit board;
   a plurality of expansion slots mounted on the circuit board, to receive a plurality of SATA DIMM modules;
   a plurality of serial advanced technology attachment (SATA) interfaces mounted on the circuit board and connected to SATA connectors of the plurality of SATA DIMM modules, wherein the number of the plurality of SATA interfaces is the same as the number of the plurality of expansion slots; and
   an edge connector set on a bottom side of the circuit board, the edge connector comprising a plurality of power pins connected to the plurality of expansion slots for providing voltages to the plurality of expansion slots, a plurality of signal pins connected to the plurality of SATA interfaces for providing SATA signals to the plurality of SATA interfaces, and a plurality of ground pins being grounded.

2. The expansion apparatus of claim 1, wherein the plurality of signal pins comprises a pair of signal input pins and a pair of signal output pins.

3. A motherboard for supporting an expansion apparatus for a serial advanced technology attachment (SATA) dual-in-line memory module (DIMM), the motherboard comprising:
   a circuit board;
   a power connector mounted on the circuit board;
   an expansion slot mounted on the circuit board, and comprising a plurality of power pins connected to the power connector for providing a voltage from the power connector, a plurality of ground pin being grounded, and a plurality of idle pins; and
   a hard disk drive controller mounted on the circuit board and connected to the plurality of idle pins for providing a SATA signal to the expansion slot through the plurality of idle pins.

4. The motherboard of claim 3, wherein the plurality of idle pins comprises four idle pins.

5. The motherboard of claim 3, wherein the expansion slot is a peripheral component interconnection express (PCIe) slot.

6. A motherboard assembly comprising:
   a motherboard comprising a first circuit board, a first expansion slot mounted on the first circuit board, a hard disk drive (HDD) controller mounted on the first circuit board, and a power connector mounted on the first circuit board, the first expansion slot comprising a plurality of first power pins connected to the power connector for receiving a voltage from the power connector, a plurality of first ground pins being grounded, and a plurality of idle pins connected to the HDD controller for receiving a SATA signal from the HDD controller; and
   an expansion apparatus comprising a second circuit board, a plurality of second expansion slots to receive a plurality of SATA DIMM modules, a plurality of serial advanced technology attachment (SATA) interfaces connected to SATA connectors of the plurality of SATA DIMM modules and set on the second circuit board, and an edge connector set on a side of the second circuit board to be detachably engaged in the first expansion slot of the motherboard, the edge connector comprising a plurality of second power pins connected to the second expansion slots for providing voltages to the plurality of SATA DIMM modules through the plurality of second expansion slots, a plurality of second ground pins being grounded, and a plurality of signal pins connected to the plurality of SATA interfaces for providing SATA signals to the plurality of SATA DIMM modules through the plurality of SATA interfaces;
   wherein in response to the edge connector of the expansion apparatus being engaged in the first expansion slot, the second power pins of the expansion apparatus are connected to the first power pins of the first expansion slot, the second ground pins of the expansion apparatus are connected to the first ground pins of the first expansion slot, and the signal pins of the expansion apparatus are connected to the idle pins of the first expansion slot.

7. The motherboard assembly of claim 6, wherein the plurality of signal pins comprises a pair of signal input pins and a pair of signal output pins.

* * * * *